United States Patent [19]

Irving

[11] 4,327,660
[45] May 4, 1982

[54] BAND FREQUENCY INDICATING SYSTEM

[75] Inventor: Donald E. Irving, Elmwood Park, Ill.

[73] Assignee: Motorola Inc., Schaumburg, Ill.

[21] Appl. No.: 849

[22] Filed: Jan. 2, 1979

[51] Int. Cl.³ .............................................. H03J 1/00
[52] U.S. Cl. .................................. 116/257; 116/282; 116/283; 116/253; 334/86
[58] Field of Search ............ 116/252, 253, 263, 256, 116/257, 285, 286, 281, 282, 283; 334/86, 77, 81

[56] References Cited

U.S. PATENT DOCUMENTS

| | | | |
|---|---|---|---|
| 1,894,111 | 1/1933 | Marcellus | 116/200 |
| 2,081,746 | 5/1937 | Hollman | 116/246 |
| 2,113,603 | 4/1938 | Polydoroff | 334/81 |
| 2,138,875 | 12/1938 | Miessner | 116/202 |
| 2,252,092 | 8/1941 | Newman | 334/77 |

FOREIGN PATENT DOCUMENTS 838275 3/1939 France ................... 116/253

*Primary Examiner*—Kyle L. Howell
*Assistant Examiner*—Denis E. Corr
*Attorney, Agent, or Firm*—James W. Gillman; James S. Pristelski; Joseph T. Downey

[57] ABSTRACT

An improved system for indicating a tuned broadcast band frequency in which a rotatable turret projects a beam of illumination along a predetermined path towards a dial scale with marking indicia indicating a selected band frequency. A carriage operative to move in a linear path tunes a predetermined band frequency as selected by an operator. The carriage engages a pivotable line on said turret so as to rotate the turret on its axis to project the light beam on the dial scale at a band frequency corresponding to the position of the carriage.

3 Claims, 2 Drawing Figures

BAND FREQUENCY INDICATING SYSTEM

BACKGROUND OF THE INVENTION

This invention generally relates to tuning mechanisms for a tunable receiver and more particularly to an improved tuning indicating system for a radio receiver or the like.

Usually radio tuning displays having tuning scales which correspond to each of the different wavebands which a radio can be tuned and is accomplished by a frequency indicating pointer operable by pushbuttons or a manual tuning knob. With the advent of improvements to tuners and band frequency displays, it has been found that the existing systems are not all together satisfactory from the standpoint of display especially in automobiles during darkness.

In accordance with the instant invention, an improved band frequency indicating system is provided which is simple and inexpensive and yet reliable. Generally speaking, the invention is accomplished by projecting a beam of light towards a dial scale corresponding to the frequency selected by an operator. While light beams have been used as indicating devices in the past as shown, for example, by U.S. Pat. No. 1,894,111 describing a light beam instrument and U.S. Pat. No. 2,138,875 describing a light beam for the purpose of theme finder, these devices do not encompass the particular structure or function or result obtained from the instant invention which is for the purpose of providing a band frequency indicating system for a radio receiver or the like. Furthermore, U.S. Pat. No. 2,081,746 describes a tuning device in which a light beam is used as a visual indicating device in a radio receiver, but this device relies upon the rotation of a scale past a fixed beam of light and is altogether different from the operation of the instant invention as will be more fully understood hereinafter.

SUMMARY OF THE INVENTION

It is therefore the primary object of the present invention is to improve band frequency indicating systems for radio receivers and the like.

A further object of the present invention is to provide an improved light projected indicating system for radio receivers and the like.

It is still a further object of the present invention to enable the operator of a radio receiver to determine instantaneously the band frequency for which the radio receiver is tuned.

It is still a further object of the present invention to facilitate the display of band frequency to which a radio receiver is tuned.

The above objects and advantages as well as others become more apparent after reading of the detailed specification to be read which will be right in conjunction with the drawing in which:

FIG. 1 is a perspective view of the improved band frequency indicating system according to the invention; and FIG. 2 is a sectional view illustrating certain details thereof.

DETAILED DESCRIPTION OF THE INVENTION

Figure 1:
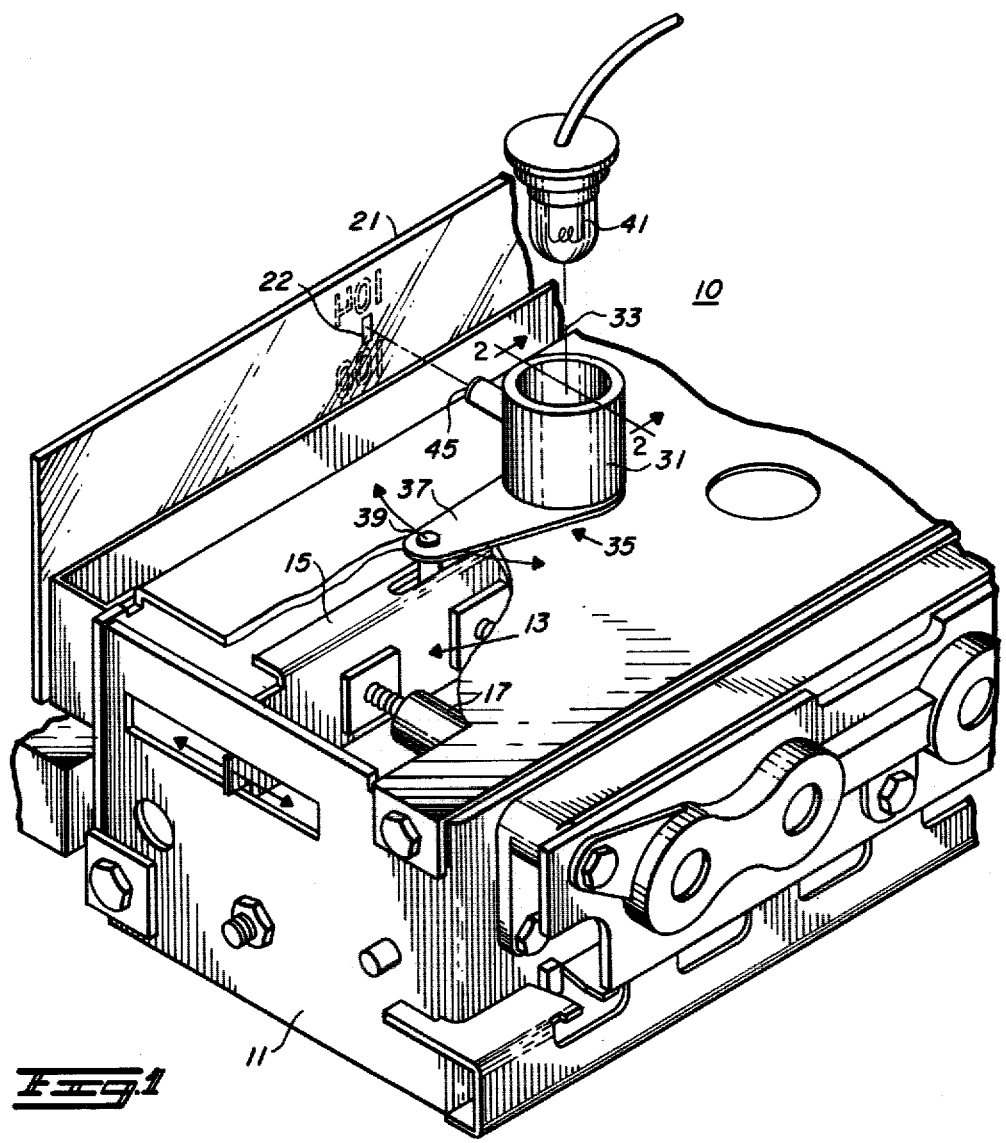
Figure 2:
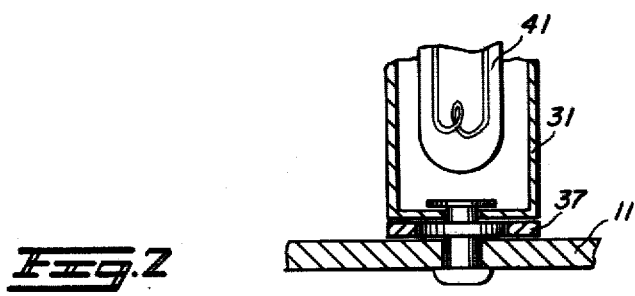

In the drawing there is shown parts of a radio receiver generally designated 10 which includes a frame 11 to provide support and protection for the components of the receiver. A tuning assembly generally designated 13 includes a core carriage 15 which is moved in a linear path for tuning the radio receiver through the displacement of core members 17 within the tuning coils not shown. The operation of the core carriage and tuning coils to select the desired frequency in either the AM or FM band frequency is well known and is not considered to be part of the present invention. A dial scale 21 which is made from translucent material has marking indicia 22 thereon for displaying the particular band frequency.

In accordance with the present invention a light beam if projected onto the dial scale 21 which corresponds to the particular frequency selected by the operator of the radio receiver. To accomplish this, a cylindrical member or turret 31 is rotatable on an axis 33 is supported on frame 11 by a crank 35 which includes link member 37 and pin 39. By this structure, turret 31 is rotated on axis 33 upon linear movement of the carriage 13 in bell crank-like fashion. Disposed within the turret 31 is a source of illumination 41 which generates illumination which projects a beam of illumination towards the dial scale 21 through an optical lens 45.

It will now be appreciated that during tuning by the operator of the radio receiver by moving the core carriage that rotation is imparted to the turret 31 and the light beam from the source of illumination 41 projected onto the dial scale as a visible marker to indicate the particular frequency corresponding to the position of the core carriage 13. It will be further appreciated that the length of the dial scale can be increased or decreased by varying the length of the link member 37 alternatively by varying the distance between the dial scale and axis of the turret and is proportional thereto.

By the invention described above, the operator of a radio receiver is instantly made aware of the band frequency being turned. Furthermore by virtue of the improved system of operation, frequency indicating is accomplished simply and reliably.

I claim:

1. A system for indicating the band frequency of a receiver comprising:
   a frame,
   a dial scale made of translucent material having marking indicia indicative of band frequency supported by said frame,
   carriage means operative to move in a linear path for tuning a radio receiver to a desired band frequency; and
   rotatable illumination means pivotally supported on said frame and drivingly engaged by said carriage means for pivoting on an axis to project a beam of light along apredetermined path towards said dial scale to indicate a band frequency corresponding to the position of said carriage means,
   wherein said illumination means includes a cylindrical member connected to a rotatable link member which is pivotally supported on said frame at one end and moves with said carriage means at the other end in the path of an arc.

2. A system according to claim 1 wherein the length of said dial scale is proportional to the length of said link member.

3. A system according to claim 1 wherein the length of said dial scale is proportional to the distance between the pivot axis and said dial scale.

* * * * *